United States Patent [19]

Marcatili

[11] Patent Number: 4,461,535

[45] Date of Patent: Jul. 24, 1984

[54] WAVELENGTH FILTERS

[75] Inventor: Enrique A. J. Marcatili, Rumson, N.J.

[73] Assignee: Bell Telephone Laboratories, Incorporated, Murray Hill, N.J.

[21] Appl. No.: 313,603

[22] Filed: Oct. 21, 1981

[51] Int. Cl.³ .............................................. G02B 5/174
[52] U.S. Cl. .................. 350/96.14; 333/209; 350/96.12
[58] Field of Search ............... 350/96.11, 96.12, 96.13, 350/96.14, 96.15, 311; 333/202, 208, 209, 210, 212

[56] References Cited

U.S. PATENT DOCUMENTS

| | | | |
|---|---|---|---|
| 3,896,402 | 7/1975 | Jackson | 333/208 |
| 4,146,297 | 3/1979 | Alferness et al. | 350/96.14 |
| 4,243,295 | 1/1981 | Alferness | 350/96.14 |
| 4,273,411 | 6/1981 | Alferness | 350/96.14 |
| 4,390,236 | 6/1983 | Alferness | 350/96.14 |

FOREIGN PATENT DOCUMENTS

| | | | |
|---|---|---|---|
| 53-3252 | 1/1978 | Japan | 350/96.12 |
| 54-7949 | 1/1979 | Japan | 350/96.12 |
| 54-110858 | 8/1979 | Japan | 350/96.12 |

Primary Examiner—John D. Lee
Attorney, Agent, or Firm—Sylvan Sherman; Gregory C. Ranieri

[57] ABSTRACT

By introducing an asymmetry in the effective refractive index profile of a waveguide, wave energy can be extracted from the waveguide by radiation at wavelengths greater than a critical wavelength, where the latter is a function of the effective index distribution. This technique is employed to develop a variety of optical wavelength filters.

18 Claims, 16 Drawing Figures

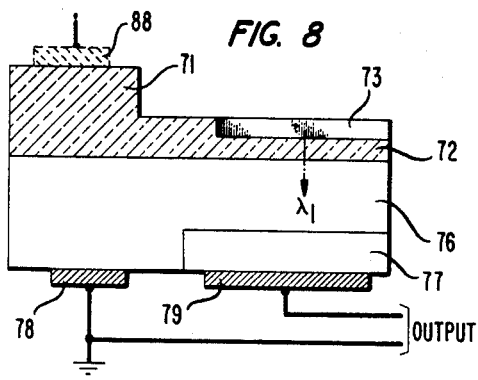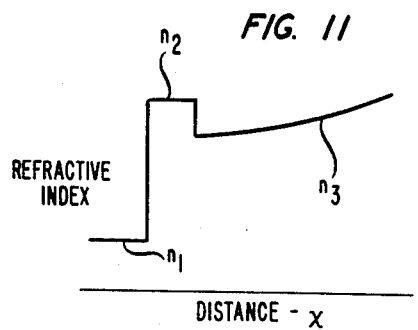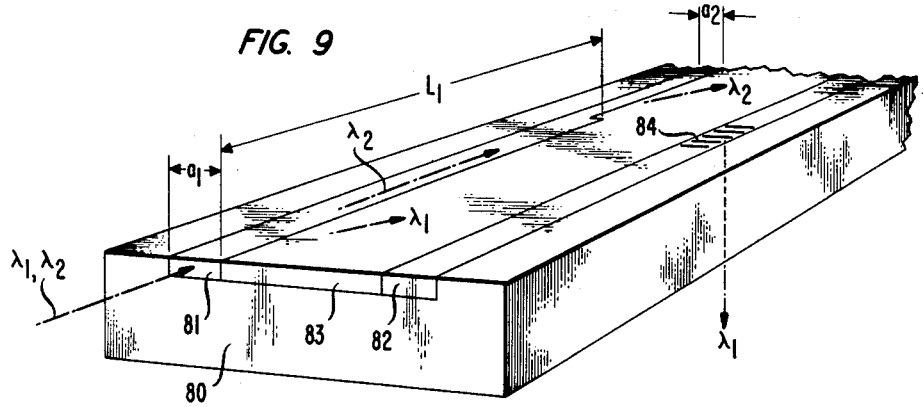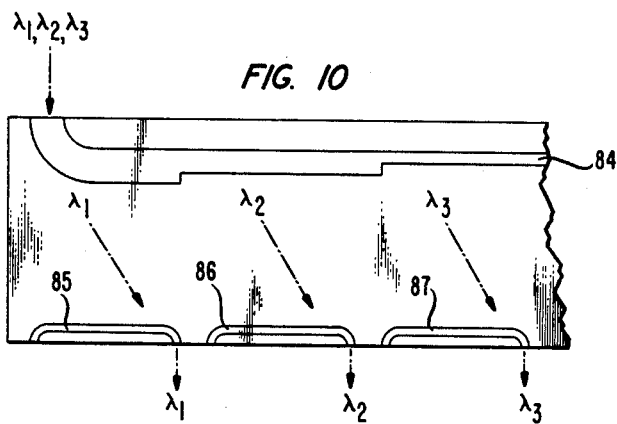

WAVELENGTH FILTERS

TECHNICAL FIELD

This application relates to frequency selective circuits and, in particular, to integrated optical filters.

BACKGROUND OF THE INVENTION

As the problems relating to the design and fabrication of broadband optical fibers are being successfully resolved, attention is now shifting to the investigation of methods for exploiting their great potential. Among the items being investigated are wavelength selective filters for separating a plurality of signals propagating along a common wavepath. Typically, directional couplers are employed for this purpose, as described, for example, in U.S. Pat. No. 4,243,295. Because such devices rely upon the interaction of evanescent fields they tend to be longer than one might prefer. In addition, they require the fabrication of two, closely spaced lightguides and associated electrodes and, as such, are relatively difficult structures to fabricate.

SUMMARY OF THE INVENTION

In a wavelength filter, in accordance with the present invention, an asymmetry is introduced in the effective refractive index profile of the wavepath. As a consequence, wave energy, whose wavelength is longer than a critical wavelength, is no longer guided by the wavepath. This radiated signal can then be collected outside the main signal path. This mechanism is employed as a means of sequentially separating signals of different wavelengths. Means for designing the filter and specifying the critical wavelength are described.

It is an advantage of the invention that the resulting filter structures are shorter than the prior art evanescent type filters. It is a further advantage that the fabrication tolerances on the tuning electrodes are significantly relaxed.

BRIEF DESCRIPTION OF THE DRAWING

FIG. 8 shows an optical detector incorporated into the embodiment of FIG. 7;

FIGS. 9 and 10 show additional embodiments of the invention;

FIG. 11 shows a modified index profile to enhance signal radiation;

DETAILED DESCRIPTION

Figure 1:
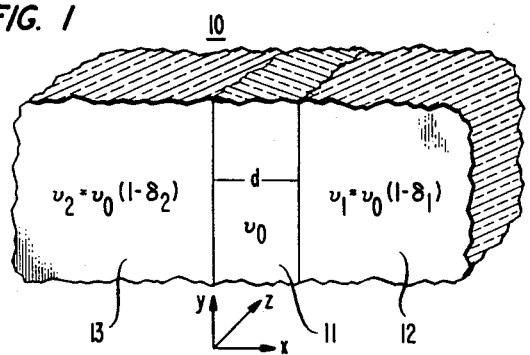
FIG. 1 shows a waveguiding structure made of three infinite slabs.
Figure 2:
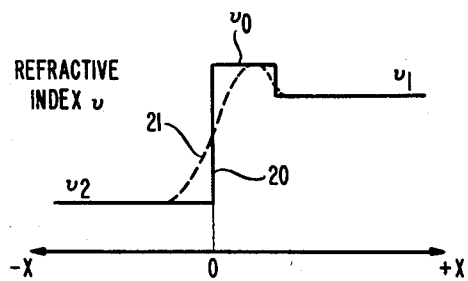
FIG. 2 shows the refractive index profile of the waveguide of FIG. 1.

The principles of the present invention are explained with reference to the waveguiding structure 10 illustrated in FIG. 1 comprising an inner planar slab 11 of material having a refractive index $\nu_o$ and width d disposed between, and in contact with a pair of outer slabs 12 and 13 of materials having refractive indices $\nu_1$ and $\nu_2$, respectively. For purposes of determining the propagation characteristics of this waveguiding structure, it is specified that all the slabs extend infinitely in the $\pm y$ directions, and the outer slabs 12 and 13 extend infinitely in the $+x$ and $-x$ directions, respectively, where x and y are normal to the direction of wave propagation z. It is further specified that the three indices $\nu_o$, $\nu_1$ and $\nu_2$ are unequal such that $\nu_o > \nu_1 > \nu_2$. A plot of the index profile is illustrated in FIG. 2. The solid line curve 20 shows the type of profile one would obtain using slabs of discrete materials. The broken line curve 21 illustrates the more typical profile obtained by diffusing impurities into substrates. The principles of the invention are equally applicable to both.

It can be shown that the equivalent refractive index of such a structure is given by $$\nu_e = \nu_o \left\{ 1 - \left(\frac{\lambda}{2d\nu_o}\right)^2 \left[ 1 - \left(\frac{1}{\sqrt{d_1}} + \frac{1}{\sqrt{d_2}}\right) \frac{\lambda}{2\pi d\nu_o} \right] \right\} \quad (1)$$

where $\lambda$ is the free space wavelength of the propagating wave energy, and $\nu_e$ is defined in terms of the propagation constant $\beta$ by $$\nu_e = \frac{\lambda \beta}{2\pi} \quad (2)$$

Figure 3:
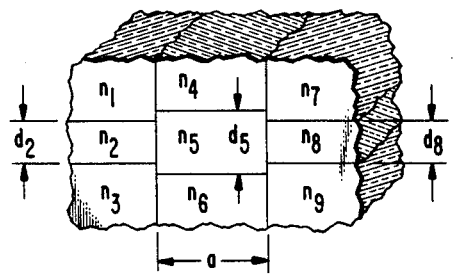
FIG. 3 shows a more generalized waveguide structure.
Figure 4:
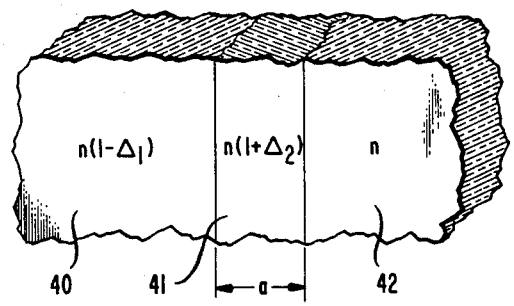
FIG. 4 shows the infinite slab waveguide equivalent of FIG. 3.

More typically, an optical waveguide can include more than three materials, as illustrated in FIG. 3. In such cases, the various regions can be combined and replaced by their equivalent refractive index, as given by equation (1). Thus, for example, the three regions $n_1$, $n_2$ and $n_3$ can be combined and represented by a first outer slab 40 of equivalent index $n(1-\Delta_1)$. Similarly, the second group of three regions, $n_4$, $n_5$ and $n_6$, can be combined and represented by a second slab 41 of width a and equivalent index $n(1+\Delta_2)$, and the third group of three regions, $n_7$, $n_8$ and $n_9$, can be combined and represented by a third slab 42 of equivalent index n. As is apparent, the configurations of FIGS. 1 and 4 are identical, thus demonstrating that a general index distribution can be approximated by its infinite slab equivalent, and the waveguiding properties of the original waveguide determined from the slab equivalent. In this regard, it can be shown that the radiation loss, R, in decibels, for the latter is given by $$R = 127.43 \cdot \frac{\Delta_2 L n}{\lambda_c} \sqrt{\frac{\lambda - \lambda_c}{\lambda_c}\left(1 - \sqrt{\frac{\Delta_2}{\Delta_1}}\right)} \quad (3)$$

where

L is the length of the waveguide;

$(\Delta_2/\Delta_1)$ is much less than one;

and $$\lambda_c = \frac{an\sqrt{32\Delta_2}}{1 - \sqrt{\Delta_2/\Delta_1}} \quad (4)$$

$\lambda_c$, given by equation (4), is the critical wavelength above which the structure no longer serves as a waveguide. That is, whereas wave energy at wavelengths shorter than $\lambda_c$ are guided, wave energy at longer wavelengths tends to radiate through the side of the structure having the higher index. The angle between the direction of radiation and guide axis is $$\theta = 2.59\sqrt{\Delta_2\left(\frac{\lambda - \lambda_c}{\lambda_c}\right)(1 - \sqrt{\Delta_2/\Delta_1})} \quad (5)$$

From equation (1) it is evident that the equivalent refractive index of an array of three different materials is a function of their respective indices and the width of the center material. Thus, any desired index distribution can be realized either by using different materials or by changes in the width of the center material. In the configurations now to be described, examples of both techniques are illustrated.

Figure 5:
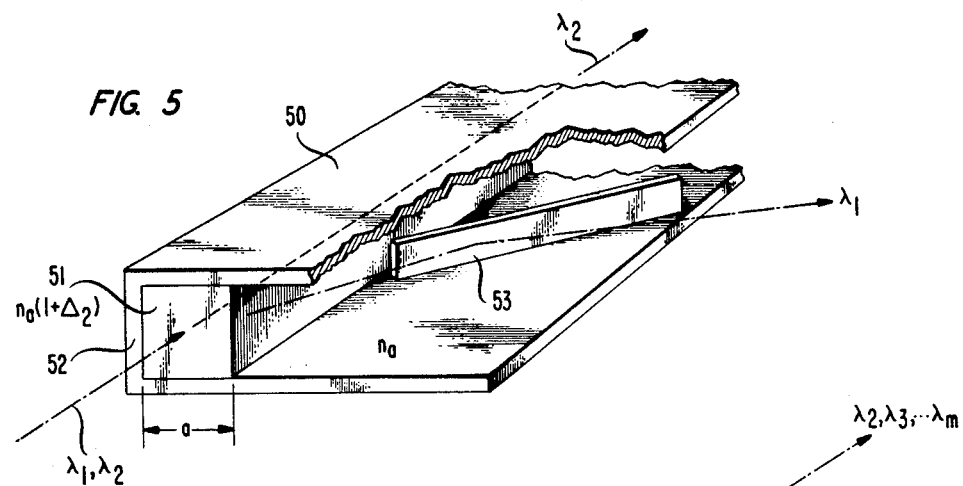
FIGS. 5, 6 and 7 show various illustrative embodiments of the invention.

FIG. 5 illustrates a first embodiment of a wavelength filter employing the above-described principles. The filter comprises a three-sided, conductive enclosure 50, within which there is included a slab 51 of material having a refractive index $n_a(1+\Delta_2)$, where $n_a$ is the index of the ambient (i.e., air). Slab 51 is placed in contact with conductive wall 52 of enclosure 50 so as to establish an asymmetric index profile of the type illustrated in FIG. 2.

In operation, signals at wavelengths $\lambda_1$ and $\lambda_2$ are directed at slab 51, where $\lambda_1 > \lambda_c > \lambda_2$, and $\lambda_c$ is as defined by equation (4). Being less than the cut-off wavelength, the signal of wavelength $\lambda_2$ is guided by the slab. The signal of wavelength $\lambda_1$, however, being longer than the cut-off wavelength, radiates out of the slab through the ambient region. A mirror 53, disposed at a convenient location redirects the radiated signal out of the filter.

Figure 6:
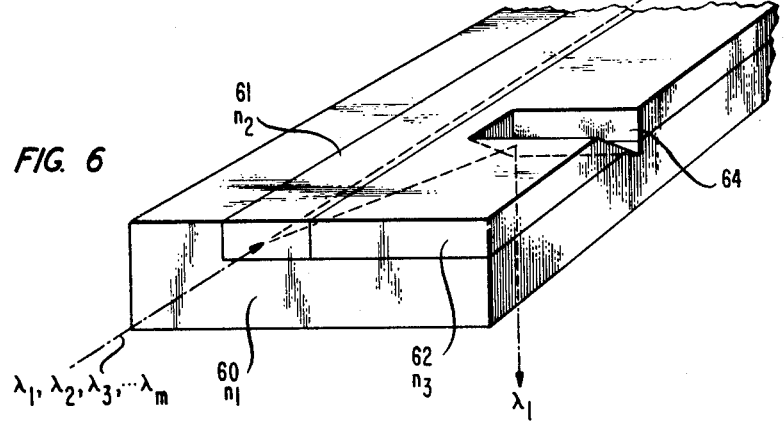

FIG. 6 shows a second embodiment of a wavelength filter comprising a substrate 60 of refractive index $n_1$ in which there is embedded a pair of strips 61 of index $n_2$, and 62 of index $n_3$, where $n_2 > n_3 > n_1$. In operation, signals of wavelengths $\lambda_1, \lambda_2, \lambda_3, \ldots \lambda_m$, are applied to strip 61 where the various indices and the width of strip 61 are such that the cut-off wavelength $\lambda_c$ falls between $\lambda_1$ and $\lambda_2$. Accordingly, $\lambda_1$ radiates out of strip 61 into strip 62, and is deflected out of the substrate by means of a groove 64 cut in strip 62. The remaining signals continue to be guided by strip 61 and can be separated by successive filter sections whose parameters are selected so as to properly place the cut-off wavelength relative to the signal wavelengths.

Figure 7:
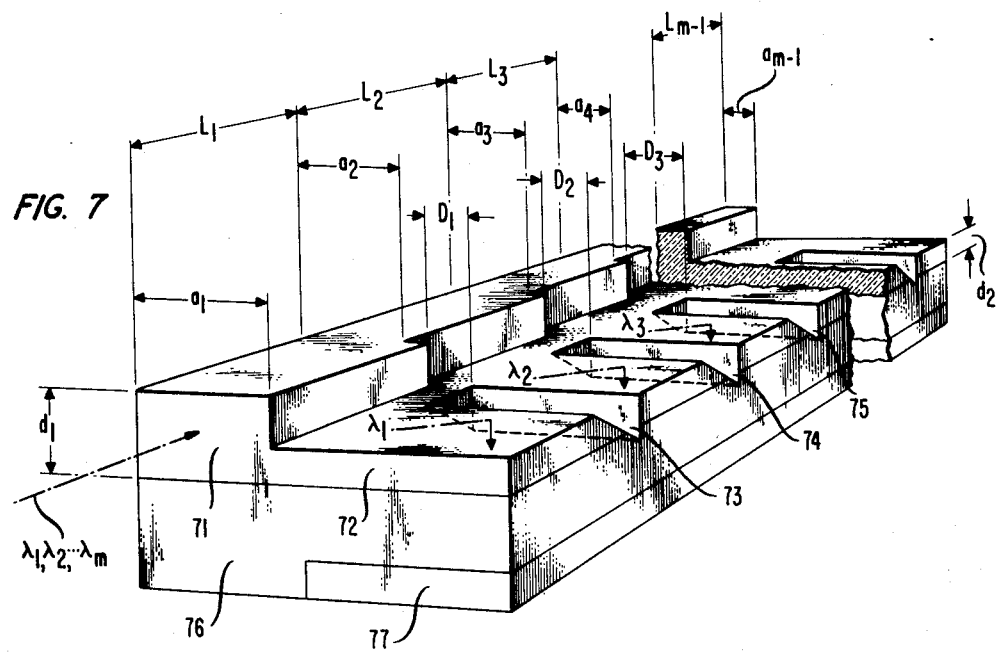

In the embodiments of FIGS. 5 and 6 the desired index profile is obtained by the use of different materials. In the embodiment of FIG. 7, now to be described, the desired asymmetric effective index profile is obtained by changing the thickness of a single material. For example, by applying equation (1) to FIG. 3, it can be shown with $n_1 = n_4$, $n_2 = n_5$ and $n_3 = n_6$, the equivalent index of the $n_4$, $n_5$, $n_6$ configuration is greater than that of the $n_1$, $n_2$, $n_3$ configuration because $d_5 > d_2$. Accordingly, in the embodiment of FIG. 7 the filter 70 comprises a slab of material whose thickness $d_1$ over a first region 71 and thickness $d_2$ over a second region 72 are such that $d_1 > d_2$. In addition, the width of the thicker portion 71 decreases in incremental steps from $a_1$ to $a_2 \ldots$ to $a_{(m-1)}$ at intervals $L_1, L_2 \ldots L_{(m-1)}$ along the direction of wave propagation, where m is an integer equal to the number of channels to be separated. Reflecting surfaces 73, 74, 75 ... are cut into the surface of the thinner region 72 for reflecting the radiated signal downward. To avoid extracting any of the guided signal energy, the reflecting surfaces are spaced at least a distance D away from the thicker portion 71 of the filter, where D is the penetration depth at which the evanescent field strength of the guided modes is reduced by a factor 1/e and is given by $$D = \frac{1 + (\Delta_2/\Delta_1)^{\frac{1}{2}}}{\pi^2 n(2\Delta_2)^{\frac{1}{2}}} \cdot \frac{\lambda_c^2}{\lambda_c - \lambda} \quad (6)$$

where $\lambda$ is the wavelength of the longest wavelength signal component smaller than $\lambda_c$ that is to remain guided along the interval of interest.

Knowing the refractive index of the filter slab material and the ambient above the slab, the effective index profile is computed using equation (1). Having calculated the index profile, and knowing the wavelengths $\lambda_1, \lambda_2 \ldots \lambda_m$ of the channels to be separated, the critical wavelength required for dropping the longest wavelength signal in successive portions of the filter can be defined and the values of $a_1, a_2 \ldots$ determined from equation (4).

The lengths $L_1, L_2 \ldots L_{(m-1)}$ of the successive longitudinal portions of the filter are determined using equation (3). The radiation loss determined by this equation is a measure of the efficiency with which the dropped signal is extracted and should be large enough to minimize crosstalk in the system. The dropped channels can be detected by discrete photodetectors located so as to intercept the signal energy deflected out of the filter by reflectors 73, 74, 75 .... Alternatively, the detectors can be included as an integral part of the filter structure. This is illustrated in greater detail in FIGS. 7 and 8 wherein the filter rests upon a semiconductor substrate 76 of n-type material in which there is embedded a p-type region 77 to form a p-n junction photodiode. A typical material that can be used for this purpose is suitably doped gallium arsenide (GaAs). Detection occurs by the application of a back-bias across the p-n junction in the region immediately below each of the reflectors. This is illustrated in FIG. 8 which is a cross section of the filter in the region of reflector 73. The bias is provided by a pair of electrodes 78 and 79 which make ohmic contact with the n-type region 76 and the p-type region 77, respectively. By providing pairs of electrodes under each of the reflectors, the individual channels are separately detected. A Schottky diode, indicates symbolically as a third electrode 88, shown in broken line, is included for tuning purposes, as will be explained in greater detail hereinbelow.

FIG. 9 shows an embodiment of the invention specifically designed to improve the efficiency with which the energy of the dropped channel is collected. The filter comprises a pair of substantially identical parallel waveguides 81 and 82 of refractive index $n(1+\delta_2)$ embedded in a substrate of lower index n. Separating the two waveguides is a region of index $n(1+\delta_1)$, where $d_2 >> \delta_1$. While the two waveguides 81 and 82 form a directional coupler, they are spaced sufficiently far apart so as to preclude any substantial coupling between guided modes over the transfer interval $L_1$. That is, the coupling coefficient k is made so small that the conventional coupling interval, $L = \pi/2k$, for complete coupling of guided modes is very much greater than the length $L_1$ needed for the complete coupling of the radiated channel. Typically, the two waveguides in an evanescent field type of directional coupler are spaced apart a distance equal to one guide width (i.e., spacing equals $a_1$). By contrast, in the radiation type directional coupler of FIG. 9, the space between guides 81 and 82 is between two and ten times the guide width $a_1$.

The incident signals are applied to waveguide 81 whose parameters are selected to cause the longest wavelength signal to be radiated from guide 81 and coupled over to waveguide 82. A grating 84 or other deflecting means along waveguide 82 deflects the dropped channel out of the filter.

To separate the shorter wavelength signals, the width of waveguide 81 is decreased in incremental steps as a means of reducing the critical wavelength and, thereby, causing the shorter wavelength signals to be sequentially radiated out of guide 81 and into guide 82.

FIG. 10 shows an alternative strip arrangement wherein each of the channels $\lambda_1$, $\lambda_2$ and $\lambda_3$ is coupled to a separate waveguide 85, 86 and 87. This eliminates the need for some form of means for separating the several channels after they have been coupled into guide 82. An advantage in this arrangement resides in the reduction in crosstalk that can result if there is leakage through the separating means (i.e., deflector 84). A disadvantage is that the curves in waveguides 85, 86 and 87 are preferably made very gradual to reduce radiation effects and, as a result, the overall length of a filter with this configuration would be longer than the embodiment of FIG. 9.

A further improvement in the coupling efficiency can be realized by a modification in the index profile shown in FIG. 11. As in the index distribution illustrated in FIG. 2, there are three regions of effective indices $n_1$, $n_2$ and $n_3$, which $n_2 > n_3 > n_1$. However, in this profile distribution the effective index of the third region gradually increases as a function of distance from its initial value of $n_3$. Thus, for example, in the embodiment of FIG. 6, the index of strip 62 would gradually increase from this initial value of $n_3$ to some higher value.

Figure 12:
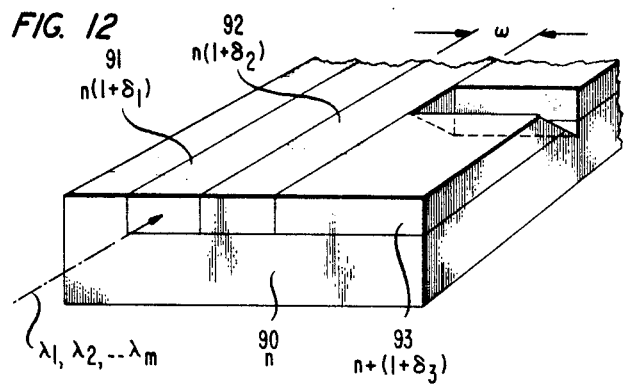
FIGS. 12 and 13 show two additional embodiments of the invention.

A further enhancement can be achieved by coupling the radiated energy through a resonant section of waveguide, as illustrated in FIG. 12. Basically, this embodiment is the same as the embodiment of FIG. 6 comprising a slab 90 of index n in which there is embedded a pair of strips 91 and 92 of indices $n(1+\delta_1)$ and $n(1+\delta_2)$, respectively, such that $\delta_1 > \delta_2$. In addition, a fourth strip 93 of constant index $n(1+\delta_3)$ has been added where $\delta_3$ is at least equal to, but preferably greater than $\delta_1$. Furthermore, the width, w, of strip 92 is chosen so as to form a resonant cavity at the wavelength of the dropped channel. That is, $$\beta_T w = (2p-1)\pi, \quad (7)$$

where $\beta_T$ is the propagation constant of the dropped channel in strip 92, in the direction perpendicular to the waveguide axis, and p is an integer.

An advantage of a resonant arrangement is that it discriminates in favor of the dropped channel, thereby reducing crosstalk. A disadvantage is that either the index or the width of strip 92 must be changed for each channel, thus complicating the fabrication process.

Figure 14:
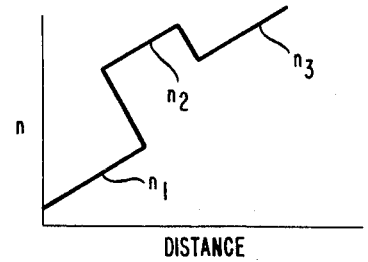
FIG. 14 shows the effective index profile of the embodiment of FIG. 13.
Figure 13:
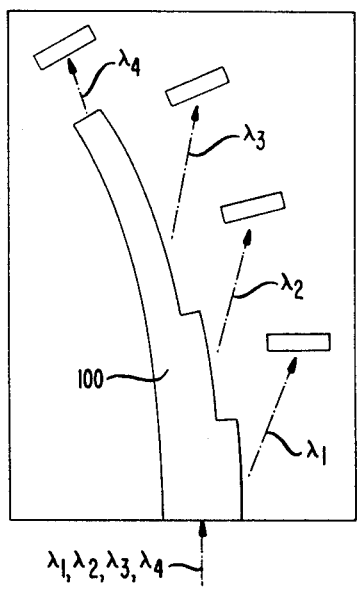

FIG. 13 shows an alternative technique for producing an effectively increasing index profile of the type shown in FIG. 11. Instead of varying the composition of the material as a means of producing an increasing profile, the waveguide 100 is curved. The effect is to produce an equivalent index profile illustrated in FIG. 14 which effectively increases as a function of the radial distance from the center of curvature.

Though not specifically noted heretofore, it is evident that in any asymmetric profile structure radiation can occur along two, mutually orthogonal planes. Thus, for example, if the parameters of the filter of FIG. 6 are not carefully selected, radiation can occur in the vertical plane defined by substrate 60, strip 61 and the ambient above strip 61, as well as in the horizontal plane defined by substrate 60, and strips 61 and 62. A simple way to avoid this is to place a layer of material of index $n_1$, above strip 61, thus forming a waveguide having a symmetric profile. An alternative is to select the indices and the cross-sectional dimensions of strip 61 such that the critical wavelength in the vertical plane is longer than the longest wavelength signal of interest.

Figure 15:
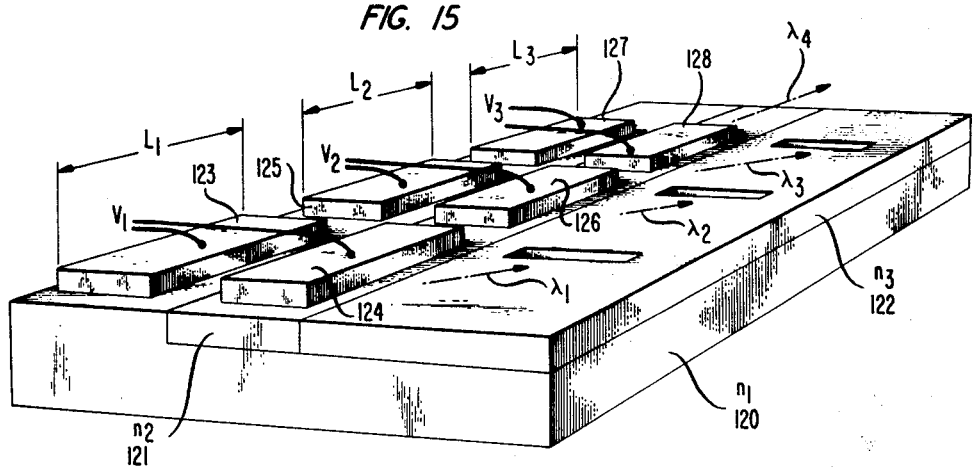

In the several embodiments of the invention described hereinabove, changes in the critical wavelength were obtained by changing the dimensions of the wavepath which, in turn, altered the effective index profile. An alternative method of tuning is illustrated in FIG. 15 which, for purposes of explanation, shows the embodiment of FIG. 6 modified to include sets of tuning electrodes longitudinally distributed along the wavepath. More specifically, the filter shown in FIG. 15 comprises a substrate 120 of refractive index $n_1 = (1-\Delta_1)$ in which there is embedded a pair of adjacent strips 121 and 122 of indices $n_2 = (1+\Delta_2)$ and $n_3$, respectively, where $n_2 > n_3 > n_1$. Superimposed upon strip 121 and substrate 120 are pairs of electrodes 123-124, 125-126 and 127-128, each extending an appropriate distance $L_1$, $L_2$ and $L_3$ therealong. A voltage $V_1$, $V_2$ and $V_3$ is impressed across the respective pairs of electrodes.

Inasmuch as the critical wavelength, as given by equation (4), is a function of $\Delta_1$ and $\Delta_2$, the filter sections can be readily tuned via the electrooptic effect, by the application of the appropriate voltage to the electrodes. Specifically, each successive filter section is tuned to radiate the longest wavelength signal present and is transmit the remaining shorter wavelength signals.

In similar fashion, region 71 in the embodiment of FIG. 7 can be made of uniform width throughout, and tuning accomplished by means of the electrooptic effect introduced via a Schottky barrier represented by an electrode 88 located above region 71 opposite electrode 78, which is shown to be connected to a common ground.

Figure 16:
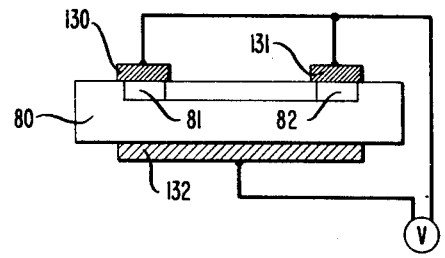
FIGS. 15 and 16 show the embodiments of FIGS. 6 and 9 modified by the inclusion of tuning electrodes.

FIG. 16 shows the use of electrodes to tune the filter of FIG. 9. Using the same identification numerals as in FIG. 9, electrodes 130 and 131 are located above strips 81 and 82, and a third, common electrode 132 is placed below substrate 80. With electrodes 130 and 131 connected together, a voltage V is simultaneously impressed across both strips. This serves to tune strip 81 without causing any inequality in the phase constants of the two strips.

In the various illustrative embodiments the deflectors are shown to be located at the ends of the respective filter sections $L_1$, $L_2$ .... This, however, is not a requirement. Indeed, for many practical reasons it is likely that each deflector will be located beyond its respective filter section, as illustrated in FIG. 13.

What is claimed is:

1. A wavelength filter comprising:
   a wavepath whose effective refractive index profile is a maximum along its longitudinal axis and decreases asymmetrically along a direction perpendicular to said axis
   said index profile defining a critical wavelength $\lambda_c$;
   and means for collecting signal wave energy radiated away from said longitudinal axis of said wavepath having a wavelength longer then $\lambda_c$.

2. The filter according to claim 1 wherein said wavepath includes a center portion having an effective refractive index $n(1+\Delta_2)$ disposed between a first outer layer of material having an effective refractive index $n(1-\Delta_1)$ and a second outer layer of material having an effective refractive index n.

3. The filter according to claim 2 wherein the critical wavelength $\lambda_c$ is given by $$\lambda_c = \frac{an\sqrt{32\Delta_2}}{1 - \sqrt{\Delta_2/\Delta_1}},$$

where:
   a is the width of said center portion between said two outer layers.

4. The filter according to claim 2 wherein the effective refractive index of said second layer increases as a function of distance from said center portion.

5. The filter according to claim 2 including a third outer layer of material contiguous with said second layer;
   said third layer having a refractive index that is greater than the refractive index of said second layer.

6. The filter according to claim 5 wherein said center portion, said second outer layer and said third outer layer form a resonant cavity tuned to the wavelength of the wave energy radiated by said center portion.

7. The filter according to claim 2 wherein said center portion is curved.

8. The filter according to claim 1 wherein said wavepath comprises a center portion disposed between a metallic slab and the ambient.

9. The filter according to claim 1 wherein said wavepath comprises a slab of material having a refractive index $n_1$, wherein there is embedded a first strip of material having a refractive index $n_2$ and a second strip of material having a refractive index $n_3$, where $n_2 > n_3 > n_1$;
   said strips being contiguous and extending coextensively along said slab;
   and wherein said means for collecting signal wave energy radiated from said filter is located within said second strip.

10. The filter according to claim 1 comprising:
    a slab of material having a first region of thickness $d_1$ and a second region of thickness $d_2$ where $d_1 > d_2$;
    tuning means included at longitudinal intervals along said first region;
    and means disposed at the end of each of said intervals for collecting wave energy radiated from said first region.

11. The filter according to claim 10 wherein said tuning means comprises incremental changes on the width of said first region.

12. The filter according to claim 10 wherein said tuning means comprises means for applying an electric field across said first region.

13. The filter according to claim 10 wherein each of said collecting means is located in said second region at least a distance D from said first region given by $$D = \frac{1 + (\Delta_2/\Delta_1)^{\frac{1}{2}}}{\pi^2 n(2\Delta_2)^{\frac{1}{2}}} \cdot \frac{\lambda_c^2}{\lambda_c - \lambda}$$

where
   $n(1+\Delta_2)$ is the effective refractive index of said first region;
   n is the effective refractive index of said second region;
   $n(1-\Delta_1)$ is the effective refractive index of a third region located agjacent to said first region and opposite said second region;
   and
   $\lambda$ is the wavelength of the longest wavelength signal component guided along the respective intervals.

14. A wavelength filter comprising:
    a pair of parallel waveguiding strips embedded in a substrate of lower refractive index and separated by a region whose refractive index is intermediate that of sad strips and said substrate, and
    the effective refractive index profile within the plane including said strips defines a critical wavelength $\lambda_c$ above which signal energy is radiated out of one of said strips and into the other of said strips through said region.

15. The filter according to claim 14 wherein the width of said one strip decreases in incremental steps at longitudinal intervals therealong so as to decrease the critical wavelength along successive intervals.

16. The filter according to claim 14 including tuning means disposed at longitudinal intervals along said strips for impressing electric fields across said strips.

17. The filter according to claim 14 including means, longitudinally disposed along said other strip, for deflecting out of said other strip wave energy radiated out of said one strip and into said other strip.

18. A wavelength filter comprising:
    a pair of parallel waveguiding strips embedded in a substrate of lower refractive index and separated by a region whose refractive index is intermediate that of said strips and said substrate, and
    the distance between said strips is equal to between two and ten times the width of one of said strips.

* * * * *